US006990387B1

United States Patent

(12) United States Patent
Freij et al.

(10) Patent No.: US 6,990,387 B1
(45) Date of Patent: Jan. 24, 2006

(54) TEST SYSTEM FOR IDENTIFICATION AND SORTING OF INTEGRATED CIRCUIT DEVICES

(75) Inventors: Nicholas J. Freij, Folsom, CA (US); Ryan D. Anderson, Folsom, CA (US); Gary Andrew, El Dorado, CA (US); Abderrahim Doukali, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/573,588

(22) Filed: May 18, 2000

(51) Int. Cl.
*G06F 19/00* (2006.01)

(52) U.S. Cl. ...................... 700/121; 713/189; 713/193; 713/194; 380/1; 380/2

(58) Field of Classification Search ................ 713/193, 713/194, 200, 201–202
See application file for complete search history.

(56) References Cited

U.S. PATENT DOCUMENTS 3,896,935 A * 7/1975 Hjelle et al. ................ 209/573
4,525,599 A * 6/1985 Curran et al. ............... 713/190
4,639,664 A * 1/1987 Chiu et al. ................. 324/73.1
5,355,320 A * 10/1994 Erjavic et al. ................. 716/4
5,627,840 A * 5/1997 Hundertmark et al. ...... 714/726
5,631,960 A * 5/1997 Likens et al. .................. 380/2
5,726,074 A * 3/1998 Yabe ........................... 438/10
5,774,544 A * 6/1998 Lee et al. ................... 713/189
5,774,545 A * 6/1998 Raghavachari .............. 713/189
5,787,174 A * 7/1998 Tuttle ......................... 713/189
5,790,663 A * 8/1998 Lee et al. ..................... 705/56
5,790,783 A * 8/1998 Lee et al. ................... 713/200
5,799,080 A * 8/1998 Padmanabhan et al. ..... 713/193
5,828,753 A * 10/1998 Davis ......................... 713/189
5,844,803 A * 12/1998 Beffa .......................... 700/121
5,856,923 A * 1/1999 Jones et al. ................. 700/121
5,892,826 A * 4/1999 Brown et al. ............... 713/190
5,907,492 A * 5/1999 Akram et al. ............... 700/121
5,915,017 A * 6/1999 Sung et al. ................. 713/187
6,043,442 A * 3/2000 Park et al. .................. 209/573
6,122,563 A * 9/2000 Beffa .......................... 700/121
6,147,316 A * 11/2000 Beffa .......................... 209/573
6,209,110 B1 * 3/2001 Chhor et al. ................ 714/718
6,354,792 B1 * 3/2002 Kobayashi et al. ...... 414/796.7
6,587,995 B1 * 7/2003 Duboc et al. .................. 716/4

* cited by examiner

*Primary Examiner*—Ayaz Sheikh
*Assistant Examiner*—Pramila Parthasarathy
(74) *Attorney, Agent, or Firm*—Schwegman, Lundberg, Woessner & Kluth, P.A.

(57) ABSTRACT

A system for identifying and sorting integrated circuit devices based on an encrypted Fuse ID information such as manufacturing and test information stored in the integrated circuit device, includes a test fixture for receiving an integrated circuit device to be identified and sorted. The system further includes a portable, user friendly processor communicatively coupled to the test fixture to read the stored encrypted device identification data from the integrated circuit device and decrypt the read encrypted Fuse ID information, and to compare the decrypted device identification data to a previously entered sort criteria and to identify and sort the integrated circuit device based on the outcome of the comparison.

30 Claims, 2 Drawing Sheets

TEST SYSTEM FOR IDENTIFICATION AND SORTING OF INTEGRATED CIRCUIT DEVICES

TECHNICAL FIELD

This invention relates generally to testing of integrated circuit devices, and more particularly, to testing of integrated circuit devices for identification and sorting purposes.

BACKGROUND

Integrated circuit device testers used in various stages of manufacturing and test operations of integrated circuit devices, are generally designed and used for functional testing of the integrated circuit devices. These testers can also be used for identifying and sorting integrated circuit devices based on functional testing, but they are generally difficult to setup, unfriendly, expensive and difficult to use for these purposes. Also the integrated circuit device testers generally require extensive modifications in hardware and software to use them for identifying and sorting the integrated circuit devices based on manufacturing and test history information.

For the reasons stated above, and for other reasons stated below which will become apparent to those skilled in the art upon reading and understanding the present specification, there is a need for a special purpose integrated circuit device tester that is inexpensive, portable, user friendly and easier to use for identifying and sorting the integrated circuit devices based on manufacturing and test history information in various manufacturing and test operations of the integrated circuit devices.

DETAILED DESCRIPTION

Figure 1:
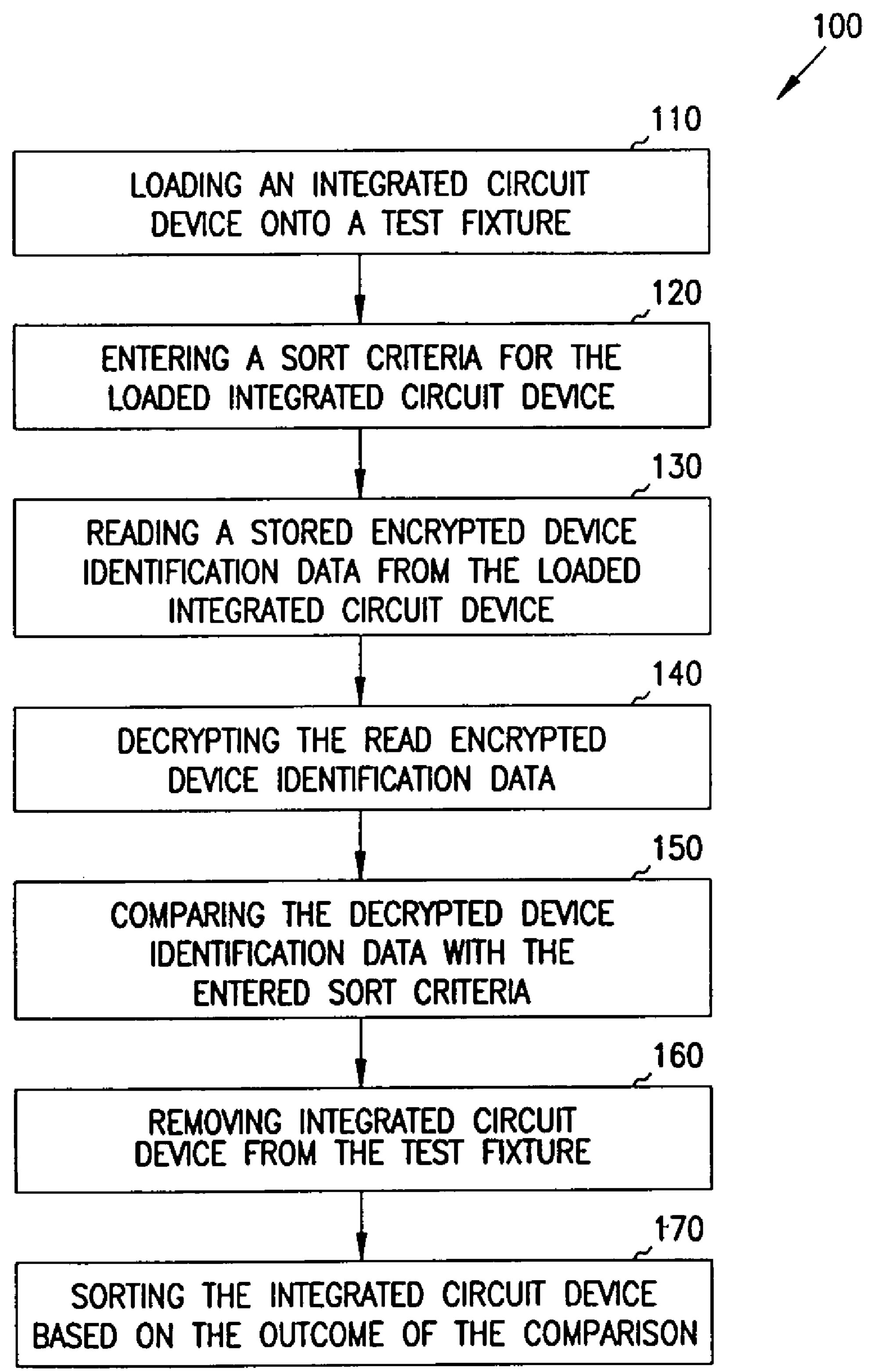
FIG. 1 is a flow diagram of one embodiment of the present invention.

In the following detailed description, reference is made to the accompanying drawings which form a part hereof, and in which are shown by way of illustration, specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents. In the drawings, like numerals describe substantially similar components throughout the several views. Like numerals having different letter suffixes represent different instances of substantially similar components.

In this document, the term, Fuse ID, is understood as a Fuse Unit located in an integrated circuit device, that houses a number of fusible elements, that can be used to store information that is unique to an integrated circuit device. Generally, Fuse ID contains manufacturing information, such as location of a wafer, wafer number (which tells which wafer, the exact location of the die on the wafer and other relevant information), lot number, date of manufacture, fab location number and other similar information related to the integrated circuit device. Generally, Fuse ID information is encrypted for security reasons. Fuse ID information, stored in the integrated circuit device, is read through a software interaction by accessing a IEEE Test Access Port (TAP) and Boundary-Scan Architecture produced by the joint Test Action Group (JTAG), often referred to simply as JTAG (an integrated circuit device designed in accordance with IEEE standard 1149.1 provides for test instruction and data to be serially transferred into the device and response data to be serially transferred out of the device using four pins included specifically for this purpose).

This document describes, among other things, a system of identifying and sorting integrated circuit devices in various manufacturing and test operations of the integrated circuit device based on Fuse ID. This is accomplished by loading an integrated circuit device onto a test fixture, and reading the stored encrypted device identification data from the integrated circuit device. The read encrypted device identification data is then decrypted, and compared to a sort criteria to identify and sort the integrated circuit device based on Fuse ID.

FIG. 1 is a flow diagram illustrating generally, by way of example, but not by way of limitation, one embodiment of a method 100 of identifying and sorting integrated circuit devices. Method 100 includes loading an integrated circuit device onto a test fixture 110. Loading can also include loading the integrated circuit devices to be identified and sorted onto a tray of a device handler. The integrated circuit device can be a microprocessor or other similar device. For some embodiments, the integrated circuit device can be any type of integrated circuit device.

The next action 120 in the process includes entering a sort criteria into a processor for the loaded integrated circuit devices. In one embodiment the entering the sort criteria further includes selecting the sort criteria for the loaded integrated circuit device to be identified and sorted, and then entering the selected sort criteria using the user friendly graphical interface into a processor. Upon completing the entering of sort data, the processor can send a first signal to the device handler, to start the identifying and sorting of the loaded integrated circuit devices. For example, the sort criteria can be based on a wafer number, a lot number, a specific identification number, or other similar criteria or any combination of these criteria. Loading the integrated circuit device onto the test fixture can also include taking an integrated circuit device from the loaded tray by the device handler, and placing the integrated circuit device onto the test fixture, upon receiving the first signal from the processor. After completing the loading of the integrated circuit device onto the test fixture, the device handler can also include sending a second signal to the processor, indicating the completion of the loading of the integrated circuit device onto the test fixture.

The next action 130 includes reading stored encrypted device identification data from the loaded integrated circuit device by the processor, upon receiving the second signal from the device handler. In one embodiment, reading the stored encrypted device identification data can include reading Fuse ID information of the integrated circuit device through a JTAG port, for extracting stored encrypted device identification data in the integrated circuit device. The next action 140 includes decrypting the read encrypted device identification data. This action 140 can also include storing the decrypted device identification data for data tracking of the read integrated circuit devices.

The next action 150 includes comparing the decrypted device identification data with the entered sort criteria by the processor. In one embodiment, the action of comparing can further include displaying an outcome of the comparison on a real-time basis based on the selected criteria. The next action 160 can further include removing the integrated circuit device from the test fixture by the device handler, upon completion of the comparison of the decrypted device identification data with the entered sort criteria by the processor.

The next action 170 in the process includes sorting the removed integrated circuit device based on the outcome of the comparison. This action can also include sorting the integrated circuit device by the device handler, by placing the integrated circuit device in a bin based on the outcome of the comparison.

In one embodiment, the above process is repeated until all of the loaded integrated circuit devices in the tray are identified and sorted.

Figure 2:
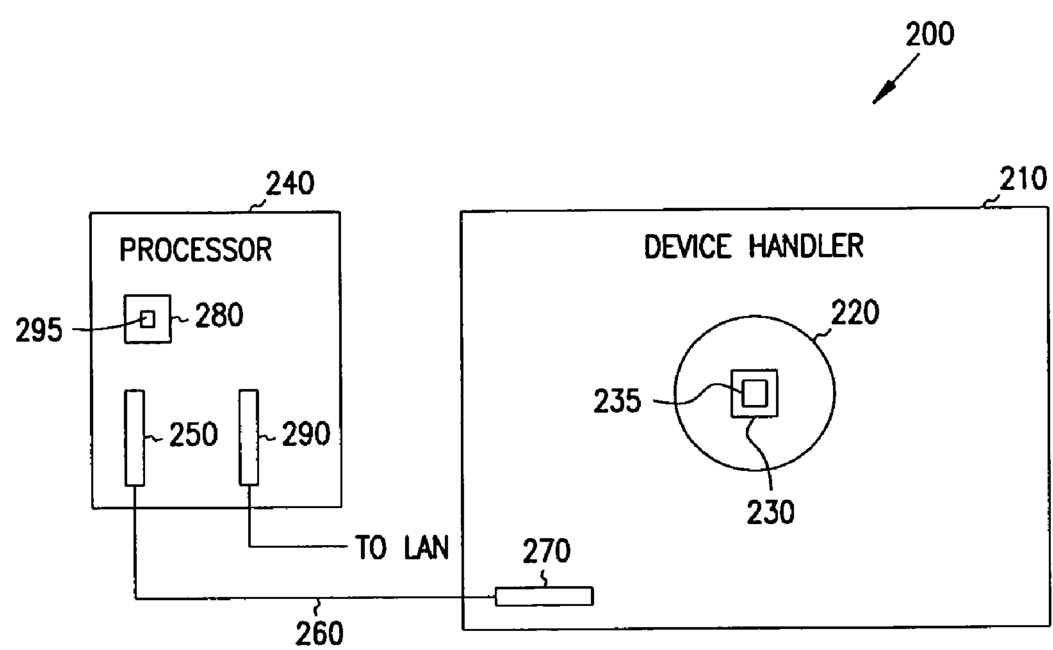
FIG. 2 is a schematic representation of one embodiment of the present invention.

FIG. 2 is a schematic diagram illustrating generally, by way of example, but not by way of limitation, one embodiment of a test system 200 for identifying and sorting integrated circuit devices according to the present invention. The test system 200 includes a device handler 210 for holding and handling loaded integrated circuit device 235 to be identified and sorted. The device handler can also include a suitable tray to receive and hold the integrated circuit devices.

The test system 200 further includes a test fixture 220. Test fixture 220 is communicatively coupled to the device handler 210. The test fixture 220 can further include a socket 230 to receive and hold an integrated circuit device 235 to be identified and sorted. Socket 230 is also communicatively coupled to the test fixture 220. The test fixture 220 can be a printed circuit board assembly including a device socket to receive and hold the integrated circuit device 235. In one embodiment the socket 230 facilitates easy loading and unloading of the integrated circuit device 235 by the device handler 210.

The test system 200 also includes a processor 240 communicatively coupled to the device handler 210 and the test fixture 220. The processor 240 can be a personal computer, including a user friendly interface such as graphical user interface for entering a sort criteria and for displaying test information. In one embodiment, the processor 240, the device handler 210 and the test fixture 220, are communicatively coupled using a Centronics cable 260. In one example, one end of the Centronics cable 260 is connected to a parallel port 270 of the device handler 210 and the other end is connected to a PCI digital input/output card 250 of the processor 240, to receive encrypted device identification data from the test fixture 220.

In one embodiment, the processor 240 sends a first signal to the device handler 210 to load an integrated circuit device 235 into the socket 230, upon entering a sort criteria into the processor 240. After completion of the loading of the integrated circuit device 235 onto the socket 230, the test fixture 220 sends a second signal to processor 240 indicating completion of the loading of the integrated circuit device 235 onto socket 230. Then processor 240 reads the encrypted device identification data stored in the integrated circuit device 235, and decrypts the read device identification data. In one embodiment, reading the encrypted device identification data comprises accessing a JTAG port of the integrated circuit device for stored Fuse ID information. Then processor 240 compares the decrypted device identification data with the sort criteria, and sends a third signal to device handler 210. Upon receiving the third signal from the processor 240, the device handler 210 removes the loaded integrated circuit device 235, and places the integrated circuit device in a bin based on the outcome of the comparison. In one embodiment, the processor can be a personal computer to provide portability to the test system 200. In one embodiment, the personal computer includes a memory 280 to store the decrypted device identification data for data tracking and maintenance. Software 295 necessary to run the user friendly graphical interface can be stored in the memory 280. In one embodiment, the user friendly graphical interface software can be written in a Visual C++ code. The user friendly graphical interface software can also be written in a programming language such as C. The Visual C++ code can be easily adapted into the personal computer, thereby making it easier to modify the test system 200 for use with almost any device handler. The memory 280 can also include a full library of PCI digital input/output card necessary to link to the graphical interface software. In one embodiment, the processor can also include a network card 290 to connect to a local area network.

CONCLUSION

The above-described test system provides, among other things, a cost-effective, user friendly and easy to use portable system for identifying and sorting integrated circuit devices based on Fuse ID in various manufacturing and test operations. The test system including the personal computer is a stand-alone controller capable of utilizing and controlling the existing device handlers. The use of the personal computer for controlling the test system, makes the test system extremely mobile. The user friendly graphical interface makes the test system easier to use. With minor modifications to the software in the personal computer, the test system can be quickly modified for use with almost any device handler. Also providing a flexible sort criteria using the user friendly graphical interface based on wafer number, lot number, specific identification number, and other such information relevant for identifying and classifying the integrated circuit devices.

It is to be understood that the above description is intended to be illustrative, and not restrictive. Many other embodiments will be apparent to those of skill in the art, upon reviewing the above description. The scope of the invention should, therefore, be determined with reference to the appended claims, along with the full scope of equivalents to which such claims are entitled.

What is claimed is:

1. A method of identifying and sorting integrated circuit devices based on a stored encrypted device identification data, comprising:

loading an integrated circuit device onto a test fixture;

entering a sort criteria for the loaded integrated circuit device using a user friendly graphical interface;

reading the stored encrypted device identification data from the loaded integrated circuit device;

decrypting the read encrypted device identification data;

comparing the decrypted device identification data with the entered sort criteria; and sorting the integrated circuit device based on the outcome of the comparison.

2. The method of claim 1, further including repeating the loading, the entering, the reading, the decrypting, the comparing, and the sorting to identify and sort a next loaded integrated circuit device onto the test fixture.

3. The method of claim 1, wherein the integrated circuit devices comprise microprocessors.

4. The method of claim 1, further including loading a tray of a device handler with the integrated circuit devices to be identified and sorted.

5. The method of claim 4, wherein the entering the sort criteria using the user friendly graphical interface for the integrated circuit device further comprises:

selecting the sort criteria for the loaded integrated circuit device to be identified and sorted;

entering the selected sort criteria using the user friendly graphical interface into a processor; and sending a first signal by the processor to the device handler to start the identifying and the sorting of the loaded integrated circuit devices upon completion of the entering the sort criteria.

6. The method of claim 5, wherein the sort criteria is selected from a wafer number, a lot number, and a specific identification number.

7. The method of claim 6, wherein the loading the integrated circuit device onto the test fixture further comprises:

taking the integrated circuit device from the tray by the device handler and placing the integrated circuit device onto the test fixture upon receiving the first signal; and sending a second signal to the processor by the device handler upon completion of the placing of the integrated circuit device in the test fixture.

8. The method of claim 7, wherein the reading the stored encrypted device identification data from the integrated circuit device comprises reading the stored encrypted device identification data from the placed integrated circuit device by the processor upon receiving the second signal.

9. The method of claim 8, wherein the reading the stored encrypted device identification data from the integrated circuit device comprises reading a fuse identification data of the integrated circuit device for extracting a stored encrypted device identification data in the integrated circuit device.

10. The method of claim 8, wherein the decrypting the read encrypted device identification data comprises decrypting the read encrypted device identification data by the processor.

11. The method of claim 10, further including logging the decrypted device identification data for data tracking and maintenance of the read integrated circuit devices.

12. The method of claim 10, wherein the comparing the decrypted device identification data with the entered sort criteria further comprises:

comparing the decrypted device identification data with the entered sort criteria by the processor; and displaying an outcome of the comparison on a real-time basis.

13. The method of claim 12, further including:

removing the integrated circuit device from the test fixture by the device handler upon completion of the comparing the decrypted device identification data with the entered sort criteria by the processor;

sorting the removed integrated circuit device by the device handler by placing the integrated circuit device in a bin based on the outcome of the comparison; and repeating the removing and the sorting of the integrated circuit devices for a next integrated circuit device loaded in the test fixture by the device handler.

14. The method of claim 12, wherein the processor comprises a personal computer.

15. The method of claim 1, wherein the stored encrypted device identification data comprises a Fuse ID.

16. The method of claim 1, wherein the reading the stored encrypted device identification data from the loaded integrated circuit device comprises reading a stored Fuse ID information through a test access port (TAP) port in the integrated circuit device.

17. A test system, comprising:

a test fixture, including a socket, the socket including an integrated circuit device capable of being identified and sorted; and a processor communicatively coupled to the test fixture and capable of reading an encrypted identification data stored in the integrated circuit device upon entering a sort criteria for the integrated circuit device using a user friendly graphical interface into the processor, decrypting the read encrypted identification data, comparing the decrypted identification data with the sort criteria, and outputting a signal based on the outcome of the comparison.

18. The test system of claim 17, further including a device handler, wherein the device handler is to load an integrated circuit device to be identified and sorted upon entering a sort criteria in to the processor.

19. The test system of claim 18, wherein the device handler is to remove the integrated circuit device from the socket and loads into a bin upon receiving the signal from the processor.

20. The test system of claim 17, wherein the processor comprises a personal computer including a digital Input/Output card to communicate with the test fixture.

21. The test system of claim 20, wherein the personal computer includes a user friendly interface for entering the sort criteria.

22. The test system of claim 21, wherein the processor further includes a memory to store the decrypted device identification data for data tracking and maintenance.

23. The test system of claim 22, wherein the memory further includes a software to run the user friendly graphical interface.

24. A test system for identifying and sorting integrated circuit devices based on an encrypted device identification data, comprising:

a device handler to hold and handle integrated circuit devices to be identified and sorted;

a test fixture, coupled to the device handler, wherein the test fixture includes a socket to receive an integrated circuit device to be identified and sorted; and a processor communicatively coupled to the test fixture and the device handler, wherein the device handler is to load an integrated circuit device onto the socket of the test fixture upon entering a sort criteria into the processor using a user friendly graphical interface and receiving a first signal from the processor to start the device handler, wherein the device handler is to send a second signal to the processor upon completion of loading of the integrated circuit device onto the socket of the test fixture, wherein the processor is to read the encrypted identification data stored in the loaded integrated circuit device through the test fixture to decrypt the read encrypted identification data, to compare the decrypted identification data to the entered sort criteria, and to send a third signal to the device handler, and wherein the device handler is to remove the loaded integrated circuit device from the socket of the test fixture and and to place the integrated circuit device in a bin based on the outcome of the comparison.

25. The test system of claim 24, wherein the processor comprises a personal computer.

26. The test system of claim 25, wherein the personal computer includes a network card, capable of being connected to a local area network.

27. The test system of claim 25, wherein the personal computer includes a digital input/output card to receive the encrypted device identification data from the test fixture, and to send a sorting information to the device handler.

28. The test system of claim 24, wherein the processor further includes a memory to store encrypted device identification data.

29. The test system of claim 24, wherein the encrypted device identification data comprises a Fuse ID information.

30. The test system of claim 29, wherein the processor is to read the Fuse ID information through a software interaction by accessing a TAP port in the loaded integrated circuit device.

* * * * *